United States Patent [19]
Yoshioka et al.

[11] Patent Number: 6,049,041
[45] Date of Patent: *Apr. 11, 2000

[54] FLEXIBLE METAL-CLAD DIELECTRICS, HAVING BERYLLIUM COPPER FOIL

[75] Inventors: Toshio Yoshioka, Tokai; Akihito Yamauchi, Handa, both of Japan

[73] Assignee: NGK Insulators, Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/745,415

[22] Filed: Nov. 12, 1996

[30] Foreign Application Priority Data

Nov. 10, 1995 [JP] Japan ................................. 7-292482
Jul. 9, 1996 [JP] Japan ................................. 8-179121

[51] Int. Cl.$^7$ ................................................. H01B 7/00

[52] U.S. Cl. .................... 174/117 FF; 174/256; 174/126.4; 174/254

[58] Field of Search ............................ 174/256, 268, 174/126.4, 254, 117 FF, 117 F; 428/416, 458

[56] References Cited

U.S. PATENT DOCUMENTS

| | | | |
|---|---|---|---|
| 3,936,575 | 2/1976 | Watanabe et al. | 428/417 |
| 4,493,568 | 1/1985 | Estabrooks | 400/124.19 |
| 4,657,601 | 4/1987 | Guha | 148/685 |
| 5,156,710 | 10/1992 | Chen et al. | 156/273.3 |
| 5,274,195 | 12/1993 | Murphy et al. | 174/268 |
| 5,384,432 | 1/1995 | Noro et al. | 174/268 |
| 5,424,030 | 6/1995 | Takahashi | 420/473 |
| 5,496,970 | 3/1996 | Spencer | 174/268 |
| 5,527,997 | 6/1996 | Saen et al. | 174/268 |

FOREIGN PATENT DOCUMENTS

| | | |
|---|---|---|
| 5-54924 | 3/1993 | Japan . |
| 7-62471 | 3/1995 | Japan . |
| 8-170128 | 7/1996 | Japan . |

*Primary Examiner*—Kristine Kincaid
*Assistant Examiner*—Kamand Cuneo
*Attorney, Agent, or Firm*—Wall Marjama Bilinski & Burr

[57] ABSTRACT

The invention provides a flexible metal-clad dielectric including a Be—Cu alloy foil, with an enriched electrical conductivity and a mean grain size of 20 $\mu$m or less, which is laminated with a highly flexible resin film. The invention thus has improved bending characteristic and significantly reduces failures in flexible printed circuit boards.

4 Claims, 1 Drawing Sheet

FLEXIBLE METAL-CLAD DIELECTRICS, HAVING BERYLLIUM COPPER FOIL

TECHNICAL FIELD

The present invention relates to a flexible metal-clad dielectric which can be used as a base member of a flexible printed circuit board.

The present invention also relates to a Be—Cu alloy foil which can be suitably used as a conductor for the above-mentioned flexible metal-clad dielectric, as well as a method for manufacturing the same.

BACKGROUND ART

Flexible metal-clad dielectrics are typically used as wiring for various electronic devices including movable parts, such as hard disc drive, floppy disc drive, printer head and the like. It is necessary for the flexible metal-clad dielectrics to have a satisfactory bending characteristic, because a poor bending characteristic tends to cause failure of wiring of the movable parts, thereby giving rise to fatal damage to the main body of the device. Moreover, in view of future devices having a miniaturized dimension and a higher operational speed, there is a demand for achieving an improved reliability in terms of the bending characteristic.

As a base member of such flexible printed circuit board, there are known two-layer type flexible metal-clad dielectric and three-layer type flexible metal-clad dielectric. The two-layer type is comprised of a resin film and a copper foil as a circuit conductor, which are directly laminated one above the other, and is relatively costly due to complicated manufacturing steps, though it is advantageous in terms of enriched bending characteristic. In contrast, the three-layer type is comprised of a copper foil which is bonded onto a resin film with an adhesive material, and has somewhat poor bending characteristic in comparison to the two-layer type, though it is advantageous in terms of low cost.

There have been various proposals for satisfying the demand for an improved bending characteristic, such as use of a conductive material for the circuit board in the form of a rolled copper foil having a satisfactory fatigue-resistance characteristic, instead of conventional electrolytic copper foil, reduction in thickness of copper foil, base film layer and adhesive material, and refinement in the adhesive material.

However, even with a flexible substrate having the best bending characteristic, the durable bending cycle is only about $1 \times 10^7$ times for the two-layer type and about $2-7 \times 10^6$ times for the three-layer type, both at a bending radius of 2 mm. Such a bending characteristic is still insufficient for the desired miniaturization and/or increased operation speed of future devices.

SUMMARY OF THE INVENTION

With an objective to improve the bending characteristic, the inventors conducted thorough investigations with respect to conventional flexible metal-clad dielectric and found that breakage of wiring in conventional flexible metal-clad dielectrics had been caused mainly due to fatigue-fracture of the copper foil itself.

The inventors further investigated materials having a satisfactory fatigue-resistance characteristic which is better than that of conventional copper foil, besides the desired electrical conductivity, and arrived at a novel recognition that Be—Cu alloy foil is particularly suitable for the intended purpose.

This recognition led the inventors to conceive the present invention.

Thus, according to a first aspect of the present invention, there is provided a flexible metal-clad dielectric which comprises a Be—Cu alloy foil having an enriched electrical conductivity, and a highly flexible resin film which are laminated one above the other.

According to a second aspect of the present invention, there is provided a flexible metal-clad dielectric which comprises a Be—Cu alloy foil having an enriched electrical conductivity and a highly flexible resin film which are laminated one above the other through a thermosetting-type adhesive layer.

In each of the above-mentioned flexible metal-clad dielectrics, it is particularly advantageous for the Be—Cu alloy foil to contain 0.2–0.7 wt % of Be, and 1.4–2.7 wt % of at least one member selected from the group consisting of Co and Ni, the balance substantially being Cu, wherein the Be—Cu alloy foil has an electrical conductivity of not less than 48% IACS (International Annealed Copper Standard).

Further, when a thermosetting-type adhesive material is used, the thickness of the adhesive layer is preferably within a range of 3–20 μm.

According to a third aspect of the present invention, there is provided a Be—Cu alloy foil for a flexible metal-clad dielectric, which contains 0.2–0.7 wt % of Be, and 1.4–2.7 wt % of at least one member selected from the group consisting of Co and Ni, the balance substantially being Cu, wherein the Be—Cu alloy foil has an electrical conductivity of not less than 48% IACS.

According to a fourth aspect of the present invention, there is provided a method of manufacturing Be—Cu alloy foil for a flexible metal-clad dielectric, which comprises the steps of: preparing a Be—Cu alloy which contains 0.2–0.7 wt % of Be, and 1.4–2.7 wt % of at least one member selected from the group consisting of Co and Ni, the balance substantially being Cu composition; subjecting the Be—Cu alloy to a solid solution treatment at a temperature of 900–1000° C. for a duration of 0.2–2 minutes; subsequently subjecting the Be—Cu alloy to a finish-rolling with a reduction of 70–95%; and subjecting the finish-rolled Be—Cu alloy to a hardening treatment at a temperature of 400–600° C. for a duration of 0.1–5 hours.

BRIEF DESCRIPTION OF THE DRAWINGS

FIG. 1 shows that the alloy foil 3 takes the form of four circuit paths passing from one end of the dielectric to the other end thereof.

Figure 1:
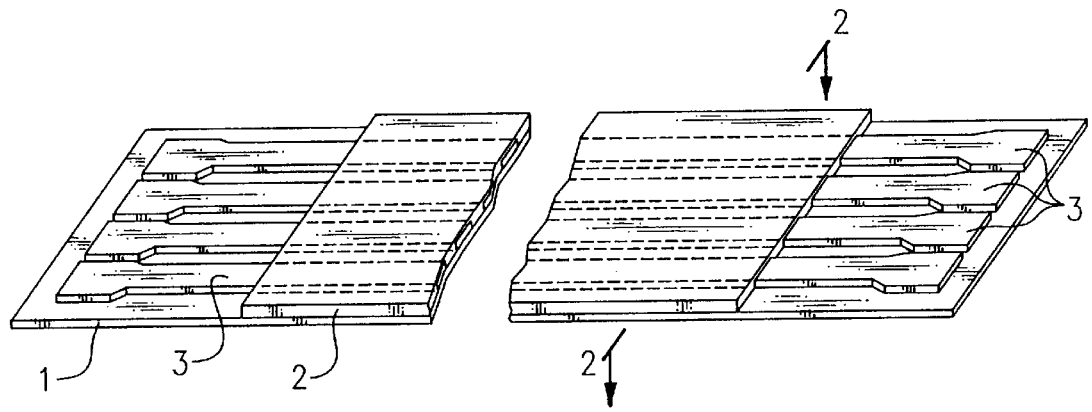
FIG. 1 is a perspective view of a flexible metal-clad dielectric according to a preferred embodiment of the present invention. The dielectric includes a first highly flexible resin film 1, a second highly flexible resin film 2 laminated on film 1, and a Be—Cu alloy foil 3 interposed therebetween. Preferably, the first 1 and second 2 resin films are laminated on the alloy foil 3 through interposed thermosetting type adhesive layers 4.
Figure 2:
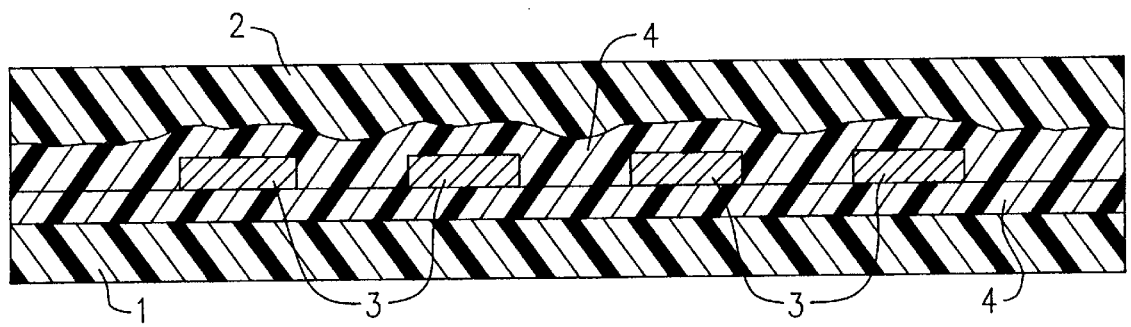
FIG. 2 shows the dielectric in cross-section through lines II—II of FIG. 1, and shows that the first resin film 1 and the second resin film 2 are substantially equal in thickness.

It is noted that Be—Cu alloy foil, per se, has a better bending characteristic than a copper foil. Still, however, in order to satisfy both fatigue-resistance characteristic and electrical conductivity required for the present invention, it is desirable for the Be—Cu alloy to contain 0.2–0.7 wt % of Be and 1.4–2.7 wt % of one element selected from the group consisting of Co and Ni, with the balance being substantially Cu composition.

Further, a conductive material for the circuit board having an excellent fatigue-resistance characteristic and an electrical conductivity of not less than 48% IACS can be advantageously manufactured according to the present invention, by subjecting the above-mentioned Be—Cu alloy to a solid solution treatment at a temperature of 900–1000° C. and for a duration of 0.2–2 minutes, to a finish-rolling with a reduction of 70–95% after the solid solution treatment, and thereafter to a hardening treatment at a temperature of 400–600° C. and for the duration of 0.1–5 hours.

The reasons for limiting the suitable composition of the Be—Cu alloy to the above-mentioned ranges will be explained below.

Be: 0.2–0.7 wt %

It is noted that Be by itself is a useful element for improving the fatigue-resistance characteristic and hence the bending characteristic. However, the addition of Be has little effect when the Be content is less than 0.2 wt %. On the other hand, the electrical conductivity deteriorates when the Be content is more than 0.7 wt %. Therefore, it is desirable to limit the Be content so as to be within the range of 0.2–0.7 wt %.

Co and/or Ni: 1.4–2.7 wt %

Co and Ni form Co-beryllide and Ni-beryllide, respectively, and contribute effectively to the improvement of the fatigue-resistance characteristic and, hence, the bending characteristic. However, when the content is less than 1.4 wt %, a sufficient amount of beryllide is not formed whereby a satisfactory fatigue-resistance characteristic cannot be achieved. On the other hand, when the content is more than 2.7 wt %, there remains excessive amount of Co or Ni not combined with Be, thereby degrading the electrical conductivity. Therefore, it is desirable to limit the Co and/or Ni content so as to be within the range of 1.4–2.7 wt %, when either one or both of them are added.

Preferred manufacturing conditions are explained below.

Solid solution treatment at 900–1000° C. for 0.2–2 minutes

The solid solution treatment is conducted to obtain a suitable material having an electrical conductivity of not more than 44% IACS and mean grain size of not more than 20 $\mu$m. In other words, when the electrical conductivity after the solid solution treatment is more than 44% IACS, the alloy elements are not sufficiently solved thereby making it difficult or impossible to simultaneously obtain suitable fatigue-resistance characteristic and electrical conductivity after the hardening treatment to be described hereinafter. On the other hand, when the mean grain size is more than 20 $\mu$m, it is difficult to apply a high rolling reduction in the successive finish-rolling and to eventually ensure an optimum fatigue-resistance characteristic.

In this instance, when the treating temperature in the solid solution treatment is less than 900° C., or the duration of the treatment is less than 0.2 min., diffusion of the alloy elements is not sufficient and the electrical conductivity after the treatment may be more than 44% IACS. On the other hand, when the treating temperature in the solid solution treatment is more than 1,000° C. or the duration of the treatment is more than 2 min., grains grow significantly so that the mean grain size may be more than 20 $\mu$m. Therefore, it is necessary to conduct the solid solution treatment within the temperature range of 900–1000° C. and for the duration of 0.2–2 min.

Finish-rolling at reduction of 70–95%

In order to manufacture a thin foil with a rolling reduction of less than 70% at the finish-rolling, there is required an extremely small thickness for the solid solution treatment process, thereby making it difficult to conduct an economical solid solution treatment. On the other hand, when the rolling reduction is more than 95%, the edge of the foil is apt to cause cracks during the rolling due to work hardening. Therefore, the rolling reduction at finish-rolling is limited so as to be within a range of 70–95%.

Hardening treatment at 400–600° C. for 0.1–5 hours

The electrical conductivity of the material is adjusted by the hardening treatment so as to be within a range of not less than 48% IACS. An electrical conductivity of less than 48% IACS is insufficient for a printed circuit board, and does not provide a satisfactory fatigue-resistance characteristic, either. However, an electrical conductivity of more than 65% IACS is within a range of softening due to overaging, causing the fatigue-resistance characteristic to deteriorate. It is therefore desirable to set the upper limit value of the electrical conductivity at 65% IACS.

In this instance, when the hardening treatment is conducted at a temperature of less than 400° C., or for the duration of the treatment is less than 0.1 hour, it becomes difficult to achieve an electrical conductivity of not less than 48% IACS due to an insufficient precipitation of Co- and/or Ni-beryllides. On the other hand, when the treatment temperature of the hardening treatment is more than 600° C., or the duration of the treatment is more than 5 hours, finely precipitated and dispersed Co- and/or Ni-beryllides undergo an aggregated growth with the result that the electrical conductivity may become higher than 65% IACS. The hardening treatment is therefore conducted on the conditions of 400–600° C. and 0.1–5 hours.

By these treatments, it is possible to manufacture Be—Cu alloy foil having excellent electrical conductivity and fatigue-resistance characteristic. The flexible metal-clad dielectric manufactured by using the so-obtained alloy foil as the circuit conductor material has better bending characteristic than conventional copper foil, as the inventors have expected.

Incidentally, by the above-mentioned bending test, it has been found that when the Be—Cu alloy foil according to the present invention is used, the three-layer type is different from the conventional type in that the adhesive layer breaks due to fatigue before breakage of the foil itself.

Therefore, in order to eliminate such a problem, the inventors conducted various experiments by using epoxy-type adhesive as an adhesive material. As a result, a recognition has been reached that the above-mentioned problem can be advantageously solved by limiting the thickness of the adhesive layer so as to be within a range of 3–20 $\mu$m which is smaller than conventional thickness of about 25 $\mu$pm. Moreover, the same is true for other types of adhesive, provided that those adhesives have a satisfactory bending characteristic comparable to that of the epoxy resin.

In the present invention, the base film has no particular limitations and any type of known resin film can be used, provided that it has a satisfactory bending characteristic, such as polyimide resin film, etc.

Preferable thickness ranges for the base resin film and Be—Cu foil will be explained as follows.

As for the base resin film, it is desirable for the thickness to be less than 50 μm, though preferably not less than 10 μm. When the thickness is not less than 50 μm, the maximum strain for the same bending radius becomes higher, which is not very suitable for the flexible metal-clad dielectric to be subjected to a higher bending load.

Furthermore, as for the Be—Cu alloy foil, it is desirable that the thickness of the foil is not more than 35 μm, though preferably not less than 5 μm. When the thickness of the Be—Cu alloy foil is more than 35 μm, the maximum strain for the same bending radius becomes higher like the base resin film, which is not very suitable for the flexible metal-clad dielectric to be subjected to a higher bending load.

Moreover, when an adhesive is used, it is desirable for the adhesive layer to have a thickness which is within a range of 3–20 μm, preferably 5–15 μm. As mentioned above, when the thickness of the adhesive layer is more than 20 μm, a fatigue of the adhesive layer occurs before occurrence of fatigue of the Be—Cu foil, with the result that an excellent bending characteristic of the Be—Cu foil cannot be effectively utilized. On the other hand, when the thickness of the adhesive layer is less than 3 μm, it is difficult to uniformly apply the adhesive onto the base resin film.

When a two-layer type flexible metal-clad dielectric is to be manufactured, a varnish of polyamide acid as a precursor of polyimide is applied onto the Be—Cu alloy foil, dried by hot blast and cured in a heating oven. In the case of three-layer type, a Be—Cu alloy foil and a polyimide resin film with an adhesive material interposed therebetween are either hot-pressed or pressed by hot rollers, and subjected to an after-curing in a heating oven.

The flexible metal-clad dielectric manufactured as above has an excellent bending characteristic of not less than $5 \times 10^7$ cycles at the bending radius of 2 mm, for both the three-layer type and two-layer type. The flexible metal-clad dielectric is thus highly promising for the flexible circuit board, from the viewpoint of miniaturization and increased operational speed of required for future devices.

EXAMPLE 1

Cu alloy comprising various composition shown in Table 1 is treated under the conditions shown in the same table, so as to form a Cu alloy foil.

The fatigue-resistance characteristic and the electrical conductivity of the Cu alloy foil obtained by the above-mentioned treatments were examined, the results of which are shown in Table 1.

The fatigue-resistance characteristic was measured by using a plate having a thickness of 0.1–0.2 mm and manufactured with the same conditions, since the foil is too thin to carry out the measurement as it is, and alternative estimation was made in connection with the number of cycles at the maximum surface stress of 70 kgf/mm².

TABLE 1

| No. | Cu alloy composition Be | Cu alloy composition Co | Cu alloy composition Ni | Conditions of solid solution treatment (° C. × min) | Electrical conductivity after solid solution treatment (%) | Mean grain size after solid solution treatment (μm) | Rolling reduction of finish-rolling (%) | Thickness of Cu alloy foil (μm) | Hardening treatment (° C. × h) | Electrical conductivity after hardening treatment (%) | Fatigue-resistant characteristic (× 10⁷ cycles) |
|---|---|---|---|---|---|---|---|---|---|---|---|
| 1 | 0.77 | — | 2.00 | 900 × 2 | 22 | 18 | 75 | 35 | 450 × 1 | 30 | 2.5 |
| 2 | 0.53 | 2.81 | — | 980 × 0.3 | 34 | 20 | 75 | 35 | 480 × 1 | 43 | 2.0 |
| 3 | 0.58 | 2.57 | — | 1010 × 0.2 | 36 | 40 | — | — | — | — | — |
| 4 | 0.42 | — | 1.86 | 930 × 3 | 37 | 24 | 75 | 35 | 450 × 1 | 58 | 1.1 |
| 5 | 0.45 | 2.51 | — | 1000 × 0.3 | 37 | 20 | 75 | 35 | 650 × 0.3 | 66 | 0.9 |
| 6 | 0.42 | — | 1.86 | 930 × 1 | 41 | 15 | 87 | 18 | 450 × 7 | 68 | 0.7 |
| 7 | 0.58 | 2.57 | — | 950 × 1 | 40 | 14 | 87 | 18 | 450 × 2 | 60 | 2.4 |
| 8 | 0.45 | 2.51 | — | 920 × 2 | 43 | 12 | 75 | 35 | 430 × 3 | 58 | 2.5 |
| 9 | 0.40 | — | 1.66 | 900 × 2 | 43 | 18 | 94 | 9 | 550 × 0.3 | 53 | 3.2 |
| 10 | 0.42 | — | 1.86 | 930 × 1 | 41 | 15 | 87 | 18 | 450 × 1 | 56 | 3.0 |
| 11 | 0.58 | 2.57 | — | 950 × 1 | 40 | 14 | 87 | 18 | 600 × 0.05 | 44 | 0.7 |
| 12 | 0.40 | — | 1.66 | 900 × 2 | 43 | 18 | 94 | 9 | 370 × 5 | 45 | 0.9 |
| 13 | 0.45 | 2.51 | — | 1000 × 0.1 | 45 | 20 | 75 | 35 | 430 × 3 | 54 | 0.8 |
| 14 | 0.40 | — | 1.66 | 870 × 2 | 47 | 8 | 94 | 9 | 550 × 0.3 | 51 | 0.7 |
| 15 | 0.31 | — | 1.23 | 960 × 0.3 | 47 | 25 | 75 | 35 | 450 × 1 | 70 | 0.4 |
| 16 | 0.16 | — | 1.50 | 930 × 1 | 48 | 16 | 75 | 35 | 400 × 3 | 73 | 0.3 |
| 17 | Cu: 100 (Rolled copper foil) | | | — | — | — | — | 18.35 | — | — | 0.01 |

As can be clearly appreciated shown from the table, each Be—Cu alloy foil manufactured according to the present invention has satisfactory fatigue-resistance characteristic and electrical conductivity.

EXAMPLE 2

The Cu alloy foils shown in Table 2 were used to form flexible metal-clad dielectrics of two-layer type and three-layer type.

Subsequently, after a suitable circuit was formed by a photoetching process, a cover coating of the same material and same thickness as the base resin film was applied and cured by heat drying in the case of two-layer type, and a film layer of the same material and same thickness as the base resin film was cover-laid by a hot press with an adhesive therebetween.

With respect to the so-obtained flexible printed circuits boards, the bending characteristics were examined by IPC (Institute for Interconnecting and Packaging Electronic Circuits)-method, with the bending radius of 2 mm, stroke of 20 mm and the speed of 1500 cpm, the results of which is shown in Table 2.

TABLE 2

| | Cu alloy foil for circuit | | Adhesive | | Base film | | Bending character- |
|---|---|---|---|---|---|---|---|
| No. | Composition | Thickness (μm) | Kind | Thickness (μm) | Kind | Thickness (μm) | istic (× $10^7$ cycles) |
| 1 | Be: 0.45. Co: 2.51 | 35 | — | | Polyimide | 25 | 6.5 |
| 2 | Be: 0.42. Ni: 1.86 | 18 | — | | Polyimide | 25 | not less than 20.0 |
| 3 | Cu: 100 (Rolled | 35 | — | | Polyimide | 25 | 0.1 |
| 4 | copper foil)* | 18 | — | | Polyimide | 25 | 0.9 |
| 5 | Be: 0.45. Co: 2.51 | 40 | Polyester | 20 | Polyimide | 25 | 0.2 |
| 6 | Be: 0.42. Ni: 1.86 | 18 | Polyester | 25 | Polyimide | 25 | 0.8 |
| 7 | Be: 0.42. Ni: 1.86 | 18 | Polyester | 20 | Polyimide | 50 | 1.7 |
| 8 | Be: 0.42. Ni: 1.86 | 18 | Polyester | 20 | Polyimide | 25 | 5.1 |
| 9 | Be: 0.42. Ni: 1.86 | 18 | Polyester | 15 | Polyimide | 25 | 7.2 |
| 10 | Be: 0.42. Ni: 1.86 | 18 | Polyester | 10 | Polyimide | 25 | not less than 10.0 |
| 11 | Be: 0.40. Ni: 1.66 | 9 | Polyester | 10 | Polyimide | 25 | not less than 10.0 |
| 12 | Be: 0.40. Ni: 1.66 | 9 | Polyester | 7 | Polyimide | 12.5 | not less than 10.0 |
| 13 | Cu: 100 (Rolled | 35 | Polyester | 25 | Polyimide | 25 | 0.04 |
| 14 | copper foil)* | 18 | Polyester | 25 | Polyimide | 25 | 0.3 |
| 15 | | 18 | Polyester | 10 | Polyimide | 25 | 0.7 |

*Comparative Samples

As can be clearly appreciated from Table 2, each flexible circuit board manufactured according to the present invention has an excellent bending characteristic of not less than $5 \times 10^7$ cycles.

It has been fully explained above that the present invention provides a Be—Cu alloy foil having an excellent fatigue-resistance characteristic suitable for a circuit board, as well as a flexible metal-clad dielectric having an excellent bending characteristic can be made which is very promising from the viewpoint of the miniaturization and increased operational speed required for future devices.

What is claimed is:

1. A flexible conductor member for connecting electronic components that are movable relative to one another, comprising (i) a Be—Cu alloy foil having an enriched electrical conductivity of not less than 48% IACS and a mean grain size of not more than 20 μm, (ii) a first highly flexible resin film laminated on a first side of said Be—Cu alloy foil, and (iii) a second highly flexible resin film laminated on a second, opposed side of said Be—Cu alloy foil, wherein the thickness of said first highly flexible resin film is substantially the same as that of the second highly flexible resin film, and said flexible conductor member has a bending characteristic of at least $5 \times 10^7$ cycles at a bending radius of 2 mm.

2. The flexible conductor member of claim 1, wherein said Be—Cu alloy foil consists essentially of 0.2–0.7 wt % Be, 1.4–2.7 wt % of at least one member selected from the group consisting of Co and Ni, and the balance substantially being Cu.

3. A flexible conductor member for connecting electronic components that are movable relative to one another, comprising (i) a Be—Cu alloy foil having an enriched electrical conductivity of not less than 48% IACS and a mean grain size of not more than 20 μm, (ii) a first highly flexible resin film laminated on a first side of said Be—Cu alloy foil through a thermosetting-type adhesive layer, and (iii) a second highly flexible resin film laminated on a second, opposed side of said Be—Cu alloy foil through a thermosetting-type adhesive layer, wherein the thickness of said first highly flexible resin film is substantially the same as that of said second highly flexible resin film, said flexible conductor member has a bending characteristic of at least $5 \times 10^7$ cycles at a bending radius of 2 mm, and said thermosetting-type adhesive layers each have a thickness of 3–20 μm.

4. The flexible conductor member of claim 3, wherein said Be—Cu alloy foil consists essentially of 0.2–0.7 wt % Be, 1.4–2.7 wt % of at least one member selected from the group consisting of Co and Ni, and the balance substantially being Cu.

* * * * *